United States Patent
Yang et al.

(10) Patent No.: US 7,062,336 B1
(45) Date of Patent: Jun. 13, 2006

(54) TIME-DIVISION METHOD FOR PLAYING MULTI-CHANNEL VOICE SIGNALS

(75) Inventors: Brian Yang, Hsinchu (TW);
Kuo-hsiang Chen, Hsinchu (TW);
Fu-yuan Cheng, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 09/414,518

(22) Filed: Oct. 8, 1999

(51) Int. Cl.
*G06F 17/00* (2006.01)
*H03F 21/00* (2006.01)
*H03F 1/04* (2006.01)
*H04B 3/00* (2006.01)
*G10L 130/00* (2006.01)

(52) U.S. Cl. .................. 700/94; 381/120; 381/80; 330/207 A; 704/258

(58) Field of Classification Search ........... 700/94; 370/369, 537, 538; 381/2, 80, 119; 455/434–37; 84/600; 704/500–504, 258, 205, 201, 267
See application file for complete search history.

(56) References Cited

U.S. PATENT DOCUMENTS

| | | | | |
|---|---|---|---|---|
| 4,733,591 A * | 3/1988 | Kaneko et al. | ............ | 84/470 R |
| 4,922,483 A * | 5/1990 | Kobayashi | .................. | 370/307 |
| 5,406,634 A * | 4/1995 | Anderson et al. | ............. | 381/80 |
| 5,469,431 A * | 11/1995 | Wendorf et al. | ............ | 370/254 |
| 5,825,899 A * | 10/1998 | Yamaguchi et al. | ........ | 381/119 |
| 6,044,307 A * | 3/2000 | Kamiya | ....................... | 700/94 |
| 6,330,338 B1 * | 12/2001 | Von Ow et al. | ............. | 381/119 |
| 6,462,264 B1 * | 10/2002 | Elam | ......................... | 704/258 |

* cited by examiner

*Primary Examiner*—Laura A. Grier
(74) *Attorney, Agent, or Firm*—Bacon & Thomas, PLLC

(57) ABSTRACT

A time-division method for playing multi-channel voice signals is provided to improve voice qualities of the multi-channel voice signals. The first feature of the present invention is that after time-division sampling, the voice signals can be directly sent to a subsequent voice generator without being demodulated beforehand. The second feature is that the ratio of a specific voice signal to a synthesized voice can be easily adjusted by changing the numbers of channels occupied by the specific voice. Consequently, the adjusting circuitry can be significantly simplified.

15 Claims, 4 Drawing Sheets

TIME-DIVISION METHOD FOR PLAYING MULTI-CHANNEL VOICE SIGNALS

BACKGROUND OF THE INVENTION

A. Field of the Invention

The invention relates to a synthesizing method of multi-channel voice signals. In particular, the invention relates to a synthesizing method, which utilizes time-division theory, capable of playing multi-channel voice signals with good voice qualities and easily adjusting the ratio of voice signals.

B. Description of the Prior Art

Conventionally, voice signals can be played via digital/analog conversion (DAC) or pulse width modulation (PWM) in consumer ICs. Synthesis of the multi-channel voice signals can be implemented by current summing or by using adder.

FIG. 1 is a block diagram showing a circuitry for playing four-channel voice signals by using DAC method and current summing. With reference to FIG. 1, the four channels 16 each has an associated voice data generator 11 and an associated D/A converter 12. When the four-channel voice is to be played, each voice data generator 11 generates a voice data that will be converted into an analog signal by the associated D/A converter 12. Then, the output signals of the D/A converters 12 are wire-anded and thus current summing is performed. The summed signal is amplified by a power amplifier 14 and then sent to a speaker 15 to generate the multi-channel voice.

Good voice qualities can be obtained when using the above-mentioned method to play multi-channel voice. However, the disadvantage is that similar circuit unit (DAC circuit) needs to be provided for each channel. Consequently, the entire circuitry will occupy a large area.

FIG. 2 is a block diagram showing a circuitry for playing four-channel voice signals by using an adder. When four-channel voice signals are to be played, the voice data generator 21 of each channel generates a voice data. Then, the two least significant bits of the voice signal in each channel are removed (that is, divide by four), and the voice signal is sent to an adder 22 to obtain a summed data. The summed data are then sent to a D/A converter 23 to be converted into an analog signal. The analog signal is amplified by a power amplifier 24 and then sent to a speaker 25 to generate the multi-channel voice.

The associated disadvantages of the method are that it requires an extra adder circuit and the resolutions of voices are lowered.

FIG. 3 is a block diagram showing a conventional circuitry for playing four-channel voice signals by using a PWM method and current summing. When multi-channel voice is to be played, the voice data generator 31 of each channel generates a respective voice signal. Then, each voice signal is sent to a PWM voice generator 32. Conventionally, the PWM voice generator 32 includes a high-speed counter and a switch. According to the positive phase or negative phase of sound wave, each PWM voice generator 32 converts the associated voice signal into two binary bits, and represents the voice volume by pulse width. Subsequently, the first bit BIT1 and the second bit BIT2 of the output of each channel are wire-anded such that current summing are implemented. The summed signals are sent to a speaker 34 to generate voices.

A disadvantage for playing multi-channel voices using a PWM method and current summing is that similar sound generator circuit unit needs to be provided for each channel. Consequently, the entire circuitry occupies a large area. Moreover, since each output is connected to each other, the output current of each channel flows to other channels, which results in waste of power.

FIG. 4 is a block diagram showing a conventional circuitry for playing four-channel voice signals by using a PWM method and an adder. When the four-channel voice signals are to be played, each voice data generator 41 generates a voice signal. Next, two least significant bits of the voice signal in each channel are removed (that is, divided by four) and then sent to an adder 42 to obtain a summed data. Subsequently, the summed data are sent to a PWM voice generator 43, which includes a high-speed counter and a switch. The output of the PWM voice generators 43 is sent to a speaker 44 for generating voices.

The associated disadvantages of this method is that it requires an extra adder circuit and the resolutions of voices are lowered because synthesis of the four-channel voice signals is based on average pulse width of each channel.

The approaches as described above cannot provide excellent synthesis of multi-channel voice signals. In view of this, a time-division multiplexing (TDM) method, which is widely used in communication systems, is utilized to play multi-channel voice signals, thereby solve the above-mentioned problems.

SUMMARY OF THE INVENTION

Accordingly, it is an object of the present invention to provide a time-division method for playing multi-channel voice signals, thereby improve voice qualities of the multi-channel voice signals.

In accordance with the present invention, the time-division method for playing multi-channel voice signals comprises the following steps:

(1) Each voice data generator generates a voice signal of an associated channel.

(2) Under the control of a set of periodical channel selecting signals, a channel selector is utilized to successively sample the voice signals of the channels such that a time-division signal comprising periodically alternative voice signal can be generated. The sampling rate is that each channel is sampled once per cycle.

(3) The channel selector sends the time-division signal without being demodulated to a voice generator including a power amplifier, for driving a speaker to generate voices.

(4) Voice volume can be adjusted by adjusting numbers of channels being occupied by that voice, thereby achieves the effect of mixing voices.

The first feature of the present invention is that after several voice signals are subject to time-division sampling, the voice signals are directly inputted to a subsequent voice generator without being demodulated, thereby achieves the effect of mixing voices. The second feature is that the ratio of a specific voice signal in the synthesized voice can be adjusted by changing the numbers of channels occupied by that voice signal.

BRIEF DESCRIPTION OF THE DRAWINGS

These and other objects and advantages of the present invention will become apparent by reference to the following description and accompanying drawings, wherein.

DETAILED DESCRIPTION OF THE PREFERRED EMBODIMENTS

To better understand the spirit of the present invention, a conventional time-division method, which is widely applied to various communication systems, is explained hereinafter.

Figure 1:
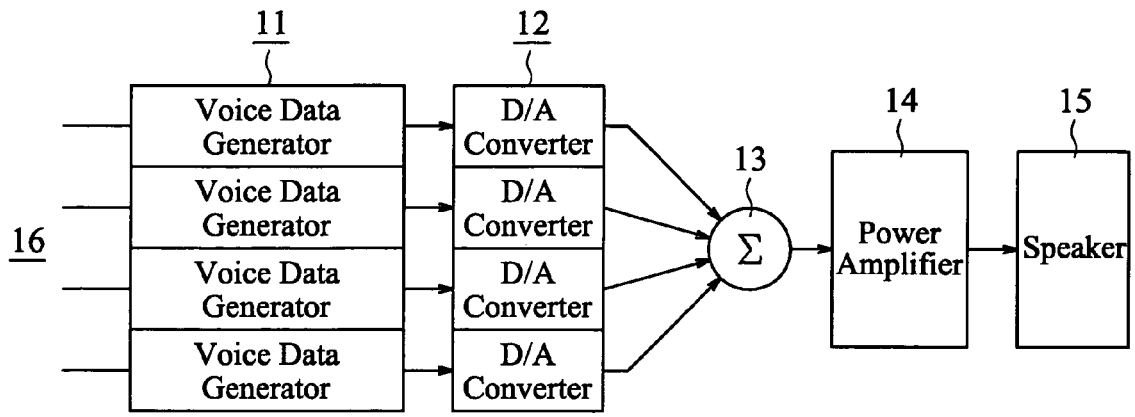
FIG. 1 is a block diagram showing a circuitry for playing four-channel voice signals using a DAC method and current summing.
Figure 2:
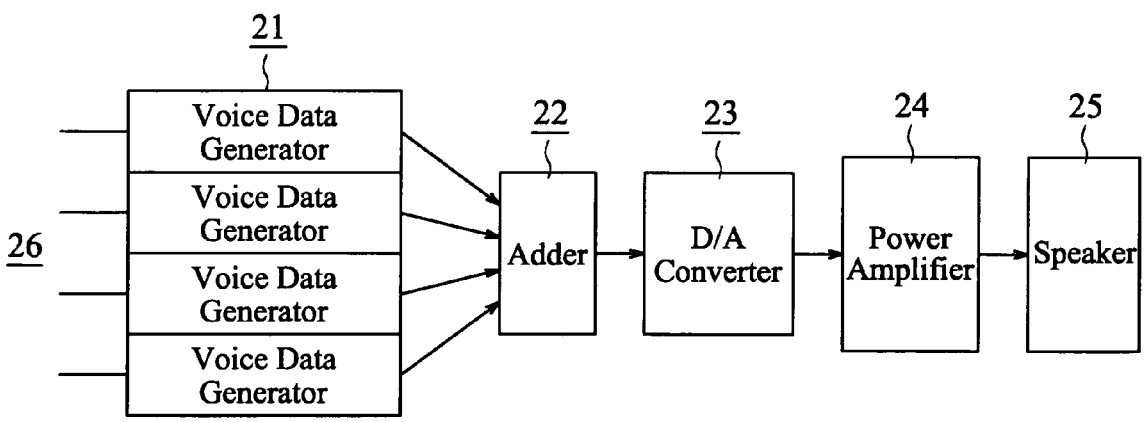
FIG. 2 is a block diagram showing a circuitry for playing four-channel voice signals using a DAC method and an adder.
Figure 3:
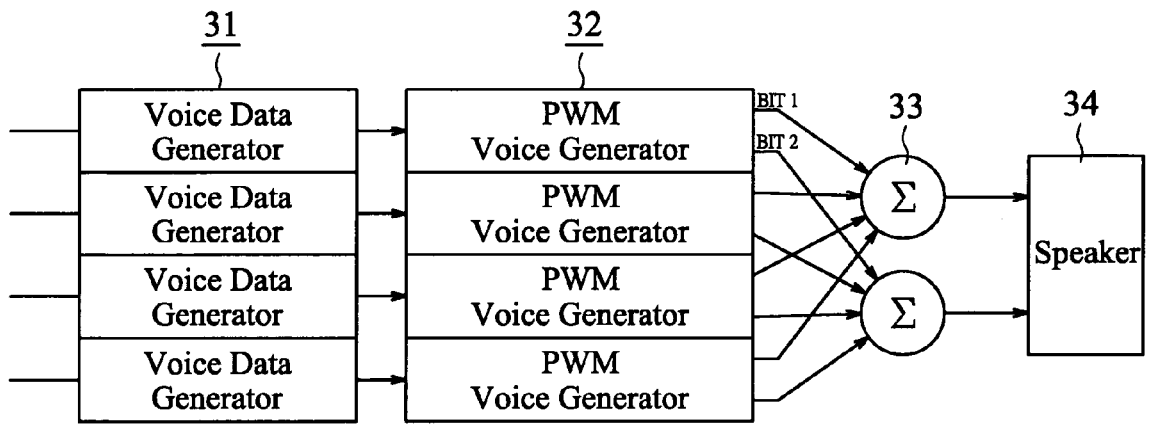
FIG. 3 is a block diagram showing a circuitry for playing four-channel voice signals using a PWM method and current summing.
Figure 4:
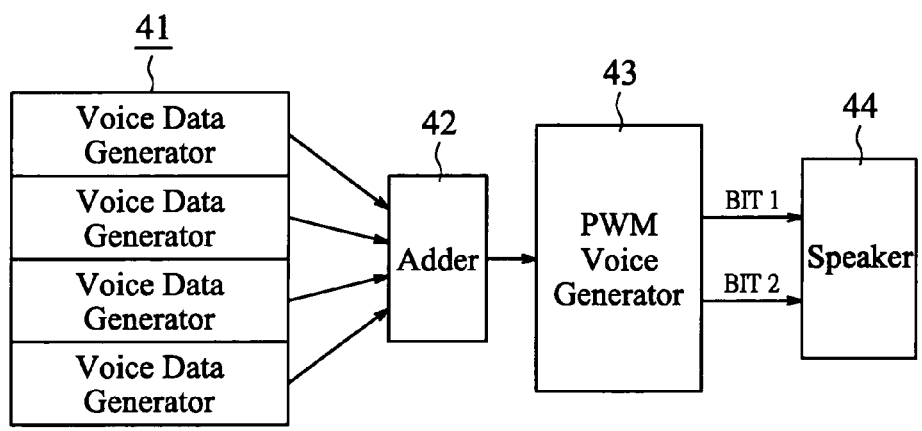
FIG. 4 is a block diagram showing a circuitry for playing four-channel voice signals using a PWM method and an adder.
Figure 5:
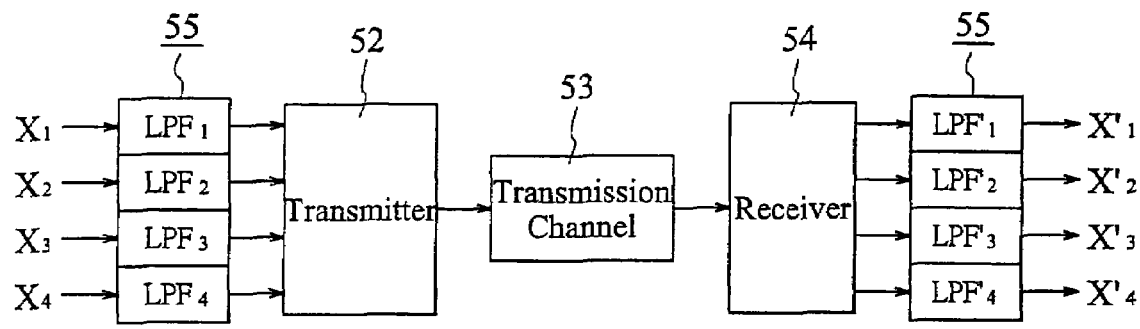
FIG. 5 is a schematic diagram showing a conventional system of a time-division multiplexing method.

FIG. 5 shows a conventional communication system which utilizes a time-division multiplexing method. As shown in FIG. 5, four voice signals $X_1 \sim X_4$ are respectively pre-filtered by low pass filters LPF1~LPF4, and then sent to a transmitter 52. Subsequently, in the transmitter 52, a multiplexer (not shown), which receives the four output signals of the low pass filters LPF1~LPF4 as its input signals, samples each input signal once per switching cycle. Therefore, the output signal of the transmitter 52 has a waveform of pulse amplitude modulation (PAM), wherein the periodically alternative sampled signals are included. These signals are sent to a receiver 54 via a transmission channel 53. In the receiver 54, a demultiplexer (not shown), which receives the signal from the transmission channel 53 as its input signal, divides the received signal into four signals and sends them to four low pass filters LPF1'~LPF4' respectively. Finally, four output signals $X_1' \sim X_4'$, which represent the four original voice signals can be derived. In theory, if each voice signal has the same bandwidth, then a sampling frequency larger than or equal to two times of the bandwidth can be utilized.

The time-division method for playing multi-channel voice signals according to the present invention is based on the above-mentioned time-division multiplexing method.

Figure 6:
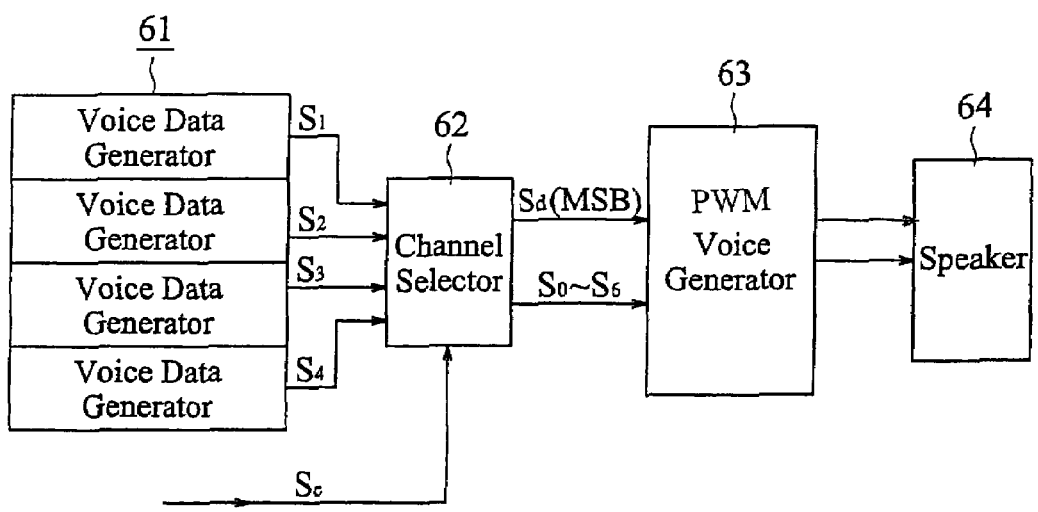
FIG. 6 is a block diagram showing a circuitry for playing four-channel voice signals using a time-division multiplexing method according to an embodiment of the present invention.

FIG. 6 is a block diagram showing a circuitry for playing four-channel voice signals with eight-bits resolutions by using a time-division method according to the present invention. Referring to FIG. 6, each one of the voice data generators 61 generates an eight-bits voice signal Si (i=1, 2,3,4), respectively. Since the most significant bit (MSB) of each of the voice signals Si (i=1,2,3,4) can be "0" or "1", each of these voice signals S1~S4 has a positive half cycle and a negative half cycle. The remaining seven bits represent the envelope of the associated voice signal (or the amplitude of the associated voice signal).

Figure 7:
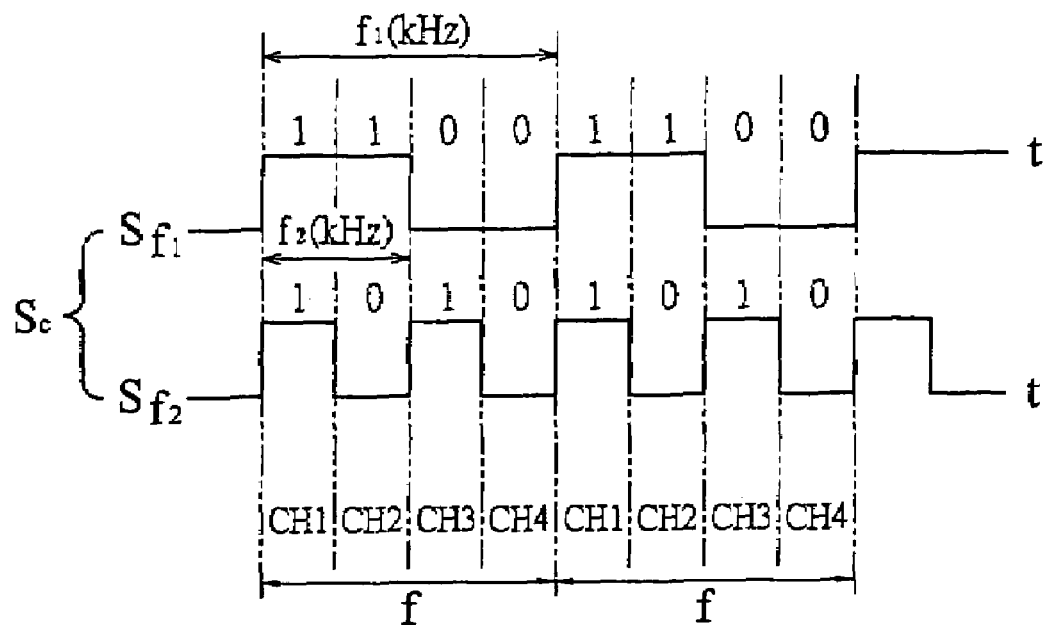
FIG. 7 is a diagram showing the waveform of a channel selecting signal SC which comprises two periodical signals $S_{f1}$, and $S_{f2}$.

On the other hand, a two-bits channel selecting signal $S_c$ is sent to the channel selector 62. In this embodiment, the channel selecting signal $S_c$ consists of two synchronous periodical signals $S_{f1}$ and $S_{f2}$, which respectively have frequencies of $f_1$ kHz and $f_2$ kHz ($f_2=2f_1$), as illustrated in FIG. 7. Accordingly, four different states of the channel selecting signal $S_c$ can be obtained, as illustrated in table 1.

TABLE 1

| State of signal $S_C$ | Signal $S_{f1}$ | Signal $S_{f2}$ |
|---|---|---|
| State 1 | "1" | "1" |
| State 2 | "1" | "0" |
| State 3 | "0" | "1" |
| State 4 | "0" | "0" |

If the states 1~4 of the signal $S_c$ corresponds to each of the voice data generators 1~4, the channel selector 62 can sample the output signals S1~S4 of the voice data generators 61 once per sampling cycle under the control of the channel selecting signal $S_c$. Subsequently, the channel selector 62 directly outputs sampled signals $S_d$ (MSB) which is periodically alternative and envelop signals $S_0 \sim S_6$ to a voice generator 63 (by using a DAC method or a PWM method).

Figure 8:
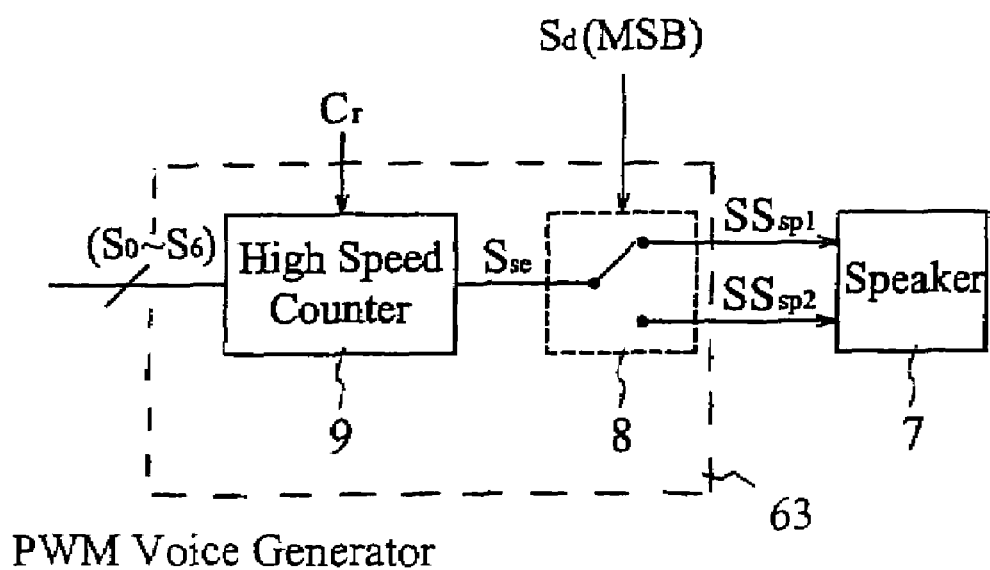
FIG. 8 is a block diagram showing a conventional PWM voice generatorry.

Taking the PWM voice generatorry as an example, the method for driving voice generator using the sampling signals ($S_d$(MSB) and $S_0 \sim S_6$) are illustrated as follows. FIG. 8 is a block diagram showing a conventional PWM voice generatorry. With reference to FIG. 8, the one-bit voice signal $S_d$(MSB) and seven-bits voice signal $S_0 \sim S_6$ outputted from the channel selector 62 are sent to a high speed counter 9 and a switch 8 of the PWM voice generator, respectively. The envelope signal $S_0 \sim S_6$ is connected to the input terminal of the high speed counter 9, wherein a control signal $C_r$ is used to control the counting of the high speed counter 9. The overflow signal of the high-speed counter 9 is used for generating a high frequency pulse $S_{se}$, whose width represents amplitude of the voice signals. Subsequently, the high frequency pulse $S_{se}$ is sent to a switch 8. Under the control of $S_d$(MSB), the switch 8 separates the high frequency pulse $S_{se}$ into a positive half cycle signal $SS_{sp1}$ and a negative half cycle signal $SS_{sp2}$ that represent the voice in that period. Finally, the signals $SS_{sp1}$ and $SS_{sp2}$ are sent to a speaker 7 to directly drive the speaker 7 to generate voices.

If several input channels are connected to one voice source, or several channels are distributed to a particular voice source, then amplitudes of the voice signals (speech or music) can be adjusted. Consequently, volume can be easily controlled and numbers of channels occupied by a specific voice signal can be easily adjusted.

As illustrated in the above embodiment, by using the time-division multiplexing method to play multi-channel voice signals in accordance with the present invention, the problem that several sets of voice generators are required and thus occupies a large area when current summing is utilized can be avoided. Besides, the problem of a deteriorated resolution caused by incorporating an adder can be avoided as well. Moreover, no extra circuit is needed since the ratio of a specific voice in the multi-channel voices can be adjusted by controlling numbers of channels occupied by a specific voice signal.

While the present invention has been described with reference to the specific embodiments, the description is only illustrative and is not to be construed as limiting the invention. For example, the numbers of channels are not limited to four. Moreover, the time-division method can be applied to a voice generator, which uses only DAC method or any other types of voice generators.

What is claimed is:

1. A method for time-divisionally outputting a plurality of voice signals, comprising the steps of:

generating the voice signals, wherein the voice signals are digital signals;

transmitting the voice signals through a plurality of channels, wherein each of the digital voice signals corresponds to one of the channels;

time-divisionally sampling the digital voice signals according to a periodic channel selecting signal to generate a multi-channel sampled signal;

sending the multi-channel sampled signal to a pulse width modulator to generate an output voice signal by adjusting the magnitude of the multi-channel sampled signal;

causing the pulse width modulator to generate based on the multi-channel sampled signal, pulses whose widths represent amplitudes of the output voice signal, converting the pulses corresponding to the multi-channel sampled signal to an analog output voice signal; and amplifying the magnitude of the output voice signal; and outputting the output voice signal.

2. The method as claimed in claim 1, wherein the period of the channel selecting signal corresponds to the number of the channels.

3. The method as claimed in claim 1, wherein the voice signals are eight-bit digital signals.

4. The method as claimed in claim 1, wherein each of the voice signals is sampled at least once per sampling cycle.

5. An apparatus for time-divisionally outputting a plurality of voice signals comprising:

a plurality of voice data generators for generating and transmitting the voice signals, wherein each of the voice signal generators includes at least a channel and each of the voice signals is transmitted through the corresponding channel;

a channel selector coupled to the voice data generators for time-divisionally sampling the voice signals according to a periodic channel selecting signal to generate a multi-channel sampled signal;

a voice generator including a pulse width modulator coupled to the channel selector for modulating the multi-channel sampled signal to generate an output voice signal, said pulse width modulator being arranged to generate, based on the multi-channel sampled signal, pulses whose widths represent amplitudes of the output voice signal, and said voice generator further converting said pulses into an output voice signal; and a speaker coupled to the voice generator for outputting the output voice signal, wherein the output voice signal is generated by adjusting magnitudes of the multi-channel sampled signals and converting the multi-channel sampled signal to the output voice signal, wherein the output voice signal is an analog signal.

6. The apparatus as claimed in claim 5, wherein the period of the channel selecting signal corresponds to the number of the channels.

7. The apparatus as claimed in claim 5, wherein the voice signals are eight-bit digital signals.

8. The apparatus as claimed in claim 5, wherein the most significant bit (MSB) of the multi-channel sampled signal is transmitted to the voice generator through a first pathway, and the remaining bits of the multi-channel sampled signal are transmitted to the voice generator through a second pathway.

9. The apparatus as claimed in claim 8, wherein the voice generator further includes a high-speed counter and a switch.

10. The apparatus as claimed in claim 9, wherein the switch is controlled according to the most significant bit of the multi-channel sampled signal.

11. The apparatus as claimed in claim 5, wherein the voice generator is a digital-to-analog converter.

12. The apparatus as claimed in claim 5, wherein the voice generator further includes a power amplifier for amplifying the magnitude of the output voice signal.

13. The apparatus as claimed in claim 5, wherein each of the voice signals is sampled at least once per sampling cycle.

14. An apparatus for time-divisionally outputting a plurality of voice signals comprising:

a plurality of voice data generators for generating and transmitting the voice signals, wherein each of the voice signal generators includes at least a channel and each of the voice signals is transmitted through the corresponding channel;

a time-division multiplexing unit coupled to the voice data generators for time-divisionally sampling the voice signals to generate a multi-channel sampled signal;

a voice generator coupled to the time-division multiplexing unit for modulating the multi-channel sampled signal to generate an output voice signal; and a speaker coupled to the voice generator for outputting the output voice signal;

wherein the output voice signal generated by the voice generator contains voice information of the plurality of voice signals.

15. The apparatus as claimed in claim 14, wherein the ratio of a first voice signal in the multi-channel sampled signal is adjusted by controlling the number of channels occupied by the first voice signal.

* * * * *